(12) United States Patent
Kim et al.

(10) Patent No.: US 8,570,797 B2
(45) Date of Patent: Oct. 29, 2013

(54) MAGNETIC RANDOM ACCESS MEMORY (MRAM) READ WITH REDUCED DISTURB FAILURE

(75) Inventors: Jung Pill Kim, San Diego, CA (US);
Tae Hyun Kim, San Diego, CA (US);
Kangho Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 268 days.

(21) Appl. No.: 13/035,006

(22) Filed: Feb. 25, 2011

(65) Prior Publication Data
US 2012/0218815 A1 Aug. 30, 2012

(51) Int. Cl.
*G11C 11/14* (2006.01)

(52) U.S. Cl.
USPC .......................................................... 365/171

(58) Field of Classification Search
USPC .......................................................... 365/171
See application file for complete search history.

(56) References Cited

U.S. PATENT DOCUMENTS

| | | | |
|---|---|---|---|
| 2007/0091671 A1* | 4/2007 | Ooishi et al. | 365/158 |
| 2007/0097730 A1 | 5/2007 | Chen et al. | |
| 2007/0195585 A1* | 8/2007 | Sakimura et al. | 365/158 |
| 2008/0238475 A1 | 10/2008 | Chua-Eoan et al. | |
| 2008/0256281 A1* | 10/2008 | Fahr et al. | 710/305 |
| 2009/0067212 A1* | 3/2009 | Shimizu | 365/148 |
| 2009/0190391 A1 | 7/2009 | Itagaki et al. | |
| 2009/0201717 A1 | 8/2009 | Maeda et al. | |
| 2010/0091557 A1 | 4/2010 | Hidaka | |
| 2010/0110757 A1* | 5/2010 | Ma et al. | 365/148 |
| 2010/0142260 A1 | 6/2010 | Yoon et al. | |
| 2011/0075471 A1* | 3/2011 | Zhu et al. | 365/158 |
| 2011/0170338 A1 | 7/2011 | Kim et al. | |
| 2013/0076390 A1* | 3/2013 | Kim et al. | 326/39 |

FOREIGN PATENT DOCUMENTS

WO WO2007111319 A1 10/2007

OTHER PUBLICATIONS

International Search Report and Written Opinion—PCT/US2012/026831—ISA/EPO—May 30, 2012.

* cited by examiner

*Primary Examiner* — Hoai V Ho
*Assistant Examiner* — Pablo Huerta
(74) *Attorney, Agent, or Firm* — Sam Talpalatsky; Nicholas J. Pauley; Joseph Agusta

(57) ABSTRACT

Magnetic tunnel junctions (MTJs) in magnetic random access memory (MRAM) are subject to read disturb events when the current passing through the MTJ causes a spontaneous switching of the MTJ due to spin transfer torque (STT) from a parallel state to an anti-parallel state or from an anti-parallel state to a parallel state. Because the state of the MTJ corresponds to stored data, a read disturb event may cause data loss in MRAM devices. Read disturb events may be reduced by controlling the direction of current flow through the MTJ. For example, the current direction through a reference MTJ may be selected based on the state of the reference MTJ. In another example, the current direction through a data or reference MTJ may be alternated such that the MTJ is only subject to read disturb events during approximately half the read operations on the MTJ.

21 Claims, 9 Drawing Sheets

US 8,570,797 B2

MAGNETIC RANDOM ACCESS MEMORY (MRAM) READ WITH REDUCED DISTURB FAILURE

TECHNICAL FIELD

The present disclosure generally relates to magnetic random access memory (MRAM). More specifically, the present disclosure relates to methods and apparatuses for reading MRAM devices.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two layers has at least one pinned magnetic polarization (or fixed layer) set to a particular polarity. The magnetic polarity of the other magnetic layer (or free layer) is altered to represent either a "1" (e.g., anti-parallel to the fixed layer) or "0" (e.g., parallel to the fixed layer). One such device having a fixed layer, a tunneling layer, and a free layer is a magnetic tunnel junction (MTJ). The electrical resistance of an MTJ is dependent on the magnetic polarity of the free layer compared to the magnetic polarity of the fixed layer. A memory device such as MRAM is built from an array of individually addressable MTJs.

FIG. 1 is a circuit schematic illustrating a portion of a conventional magnetic random access memory (MRAM). An MRAM 100 is divided into a number of bitcells 110, 140, 160. During read out of the bitcell 160, the resistance of the bitcell 160 is compared to the reference parallel bitcell 110 and the reference anti-parallel bitcell 140. Resistance of the bitcells 110, 140, 160 are measured by applying a source voltage and determining an amount of current flowing through the bitcells 110, 140, 160. For example, in the bitcell 110, a voltage source 120 is applied to a magnetic tunnel junction (MTJ) 112 by read select transistors 122, 124, and a word line select transistor 126. The MTJ 112 includes a fixed layer 114, tunneling layer 116, and a free layer 118. When the free layer 118 and the fixed layer 114 have magnetizations aligned substantially parallel, the resistance of the MTJ 112, and thus the bitcell 110, is low. When the free layer 118 and the fixed layer 114 have magnetizations aligned substantially anti-parallel, the resistance of the MTJ 112, and thus the bitcell 110, is high.

Data may also be stored in the MTJ 112 by passing current through the MTJ 112 to cause spin transfer torque (STT). Thus, when current is passed through the MTJ 112 for a read operation, the MTJ 112 may be subject to a read disturb event in which the stored value of the MTJ 112 is changed.

FIG. 2A is a graph illustrating a read disturb event thr a magnetic tunnel junction in an anti-parallel state. When a current flows through a magnetic tunnel junction in an anti-parallel state from a free layer of the MTJ to a fixed layer of the MTJ, the MTJ is subject to a read disturb event. In a graph 200 a line 202 represents the resistance of an MTJ in an anti-parallel state as a function of current through the MTJ, where positive current denotes current flowing in a direction from the free layer to the fixed layer. A line 204 represents the resistance of a MTJ in a parallel state as a function of current through the MTJ.

When a read operation is performed on an MTJ in an anti-parallel state, current flowing through the MTJ may be at a point 206. At a point 208 current flowing through the anti-parallel state MTJ causes the MTJ to spontaneously switch to a parallel state. The region between the point 206 and the point 208 is the read disturb margin. Any variations in manufacturing, of the MTJ or associated circuitry may move the point 206 closer to the point 208. When the current exceeds point 208, the data stored in the MTJ is lost due to the read disturb event.

When current is applied in the positive direction through a parallel state MTJ, the MTJ is not subject to read disturb. A point 210 indicates the current passing through a parallel state MTJ during a read operation. Increasing the current through parallel state MTJ does not spontaneously switch the MTJ to an anti-parallel state. However, the parallel state MTJ is subject to read disturb when current flows through the MTJ in the opposite direction.

FIG. 2B is a graph illustrating a read disturb event for a magnetic tunnel junction in a parallel state. A point 220 indicates the current flowing through a parallel state MTJ during a read operation. A point 222 indicates a current level causing spontaneous switching of the MTJ from a parallel state to an anti-parallel state. The region between the point 220 and the point 222 is the read disturb margin for a parallel state MTJ. Any variations in manufacturing of the MTJ or associated circuitry may move the point 220 closer to the point 222. When the current exceeds point 222, the data stored in the MTJ is lost due to the read disturb event.

When current is applied in the negative direction through an anti-parallel state MTJ, the MTJ is not subject to read disturb. A point 224 indicates the current passing through an anti-parallel state MTJ during a read operation. Increasing the current through the anti-parallel state MTJ does not spontaneously switch the MTJ to a parallel state.

As the size of the MTJ and the bitcells in MRAM shrink to increase MRAM density, the read disturb margin further shrinks, and the MTJs are more frequently subject to read disturb events. Thus, there is a need for an MRAM device with reduced read disturb.

BRIEF SUMMARY

In an aspect of the present disclosure, an apparatus, includes a magnetic tunnel junction having a first terminal and a second terminal. The apparatus also has a first multiplexer coupled to the first terminal of the magnetic tunnel junction. The first multiplexer is coupled to a voltage source, and is coupled to a ground. The first multiplexer is configured to receive a first control signal to toggle the voltage source and the ground to the first terminal. The apparatus also has a second multiplexer coupled to the second terminal of the magnetic tunnel junction. The second multiplexer is coupled to the voltage source and is coupled to the ground. The second multiplexer is configured to receive a second control signal to toggle the voltage source and the ground to the second terminal.

In another aspect, a method includes passing a first current through a parallel reference magnetic tunnel junction from a free layer to a fixed layer of the parallel reference magnetic tunnel junction. The method also includes passing a second current through an anti-parallel reference magnetic tunnel junction from a fixed layer to a free layer of the anti-parallel reference magnetic tunnel junction. The method further includes reading a data magnetic tunnel junction during the passing of the first current and the passing the second current.

In a further aspect, a method includes passing current in a first direction, from a free layer to a fixed layer, through a parallel reference magnetic tunnel junction, an anti-parallel reference magnetic tunnel junction, and a data magnetic tunnel junction during a first read operation. The method also includes passing current in a second direction, from a fixed layer to a free layer, through the parallel reference magnetic tunnel junction, the anti-parallel reference magnetic tunnel junction, and the data magnetic tunnel junction during a second read operation. The second direction is different from the first direction. The first read operation and the second read operation form a sequence.

In another aspect, an apparatus includes a magnetic tunnel junction having a first terminal and a second terminal. The apparatus also includes a first means for multiplexing coupled to the first terminal of the magnetic tunnel junction. The first multiplexing means is coupled to a voltage source and is coupled to a ground. The first multiplexing means is configured to toggle the first terminal between the voltage source and the ground. The apparatus also has a second means for multiplexing coupled to the second terminal of the magnetic tunnel junction. The second multiplexing means is coupled to the voltage source and is coupled to the ground. The second multiplexing means is configured to toggle the second terminal between the voltage source and the ground.

In yet another aspect, a method includes the step of passing a first current through a parallel reference magnetic tunnel junction from a fixed layer to a free layer of the parallel reference magnetic tunnel junction. The method also includes the step of passing a second current through an anti-parallel reference magnetic tunnel junction from a free layer to a fixed layer of the anti-parallel reference magnetic tunnel junction. The method further includes the step of reading a data magnetic tunnel junction during the passing of the first current and the passing of the second current.

According to yet another aspect, a method includes the step of passing current in a first direction, from a free layer to a fixed layer, through a parallel reference magnetic tunnel junction, an anti-parallel reference magnetic tunnel junction, and a data magnetic tunnel junction during a first read operation. The method also includes the step of passing current in a second direction, from a fixed layer to a free layer, through the parallel reference magnetic tunnel junction, the anti-parallel reference magnetic tunnel junction, and the data magnetic tunnel junction during a second read operation. The second direction is different from the first direction. The first read operation and the second read operation form a sequence.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Read disturb in magnetic tunnel junctions (MTJs) of a magnetic random access memory (MRAM) may be reduced by reducing the number of times current flows through the magnetic tunnel junction in a direction that subjects the magnetic junction to read disturb. According to one embodiment, read disturb is reduced in reference MTJs of an exemplary MRAM by selecting a direction of current flow through the reference MTJ based on the orientation of free and fixed layers of the reference MTJ. According to another embodiment, read disturb is reduced in reference and data MTJs by alternating the direction of current flow through the reference and data MTJs. The direction of current flow through an MTJ may be controlled by a multiplexer coupling the MTJ to a ground and a source voltage.

Figure 1:
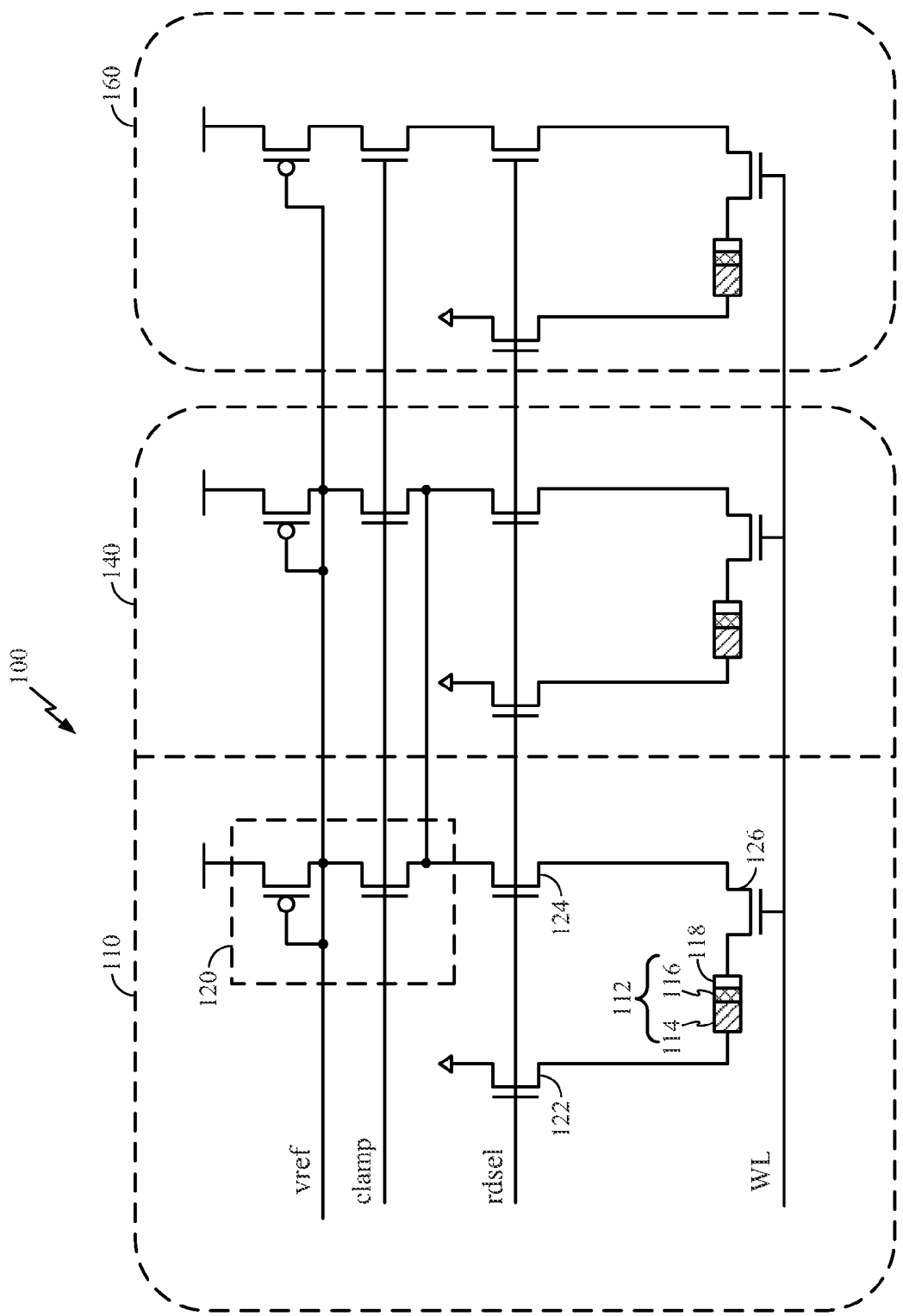
FIG. 1 is a circuit schematic illustrating a portion of a conventional magnetic random access memory (MRAM).
Figure 2A:
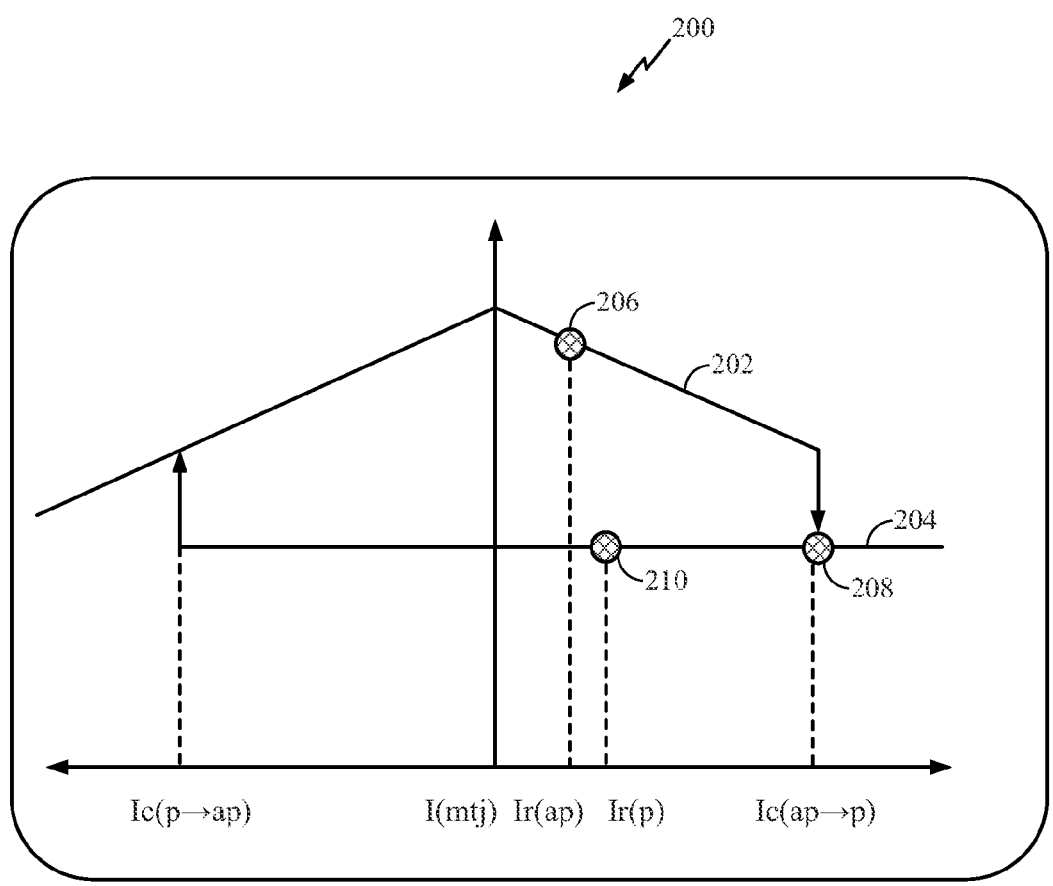
FIG. 2A is a graph illustrating a read disturb event for a magnetic tunnel junction in an anti-parallel state.
Figure 2B:
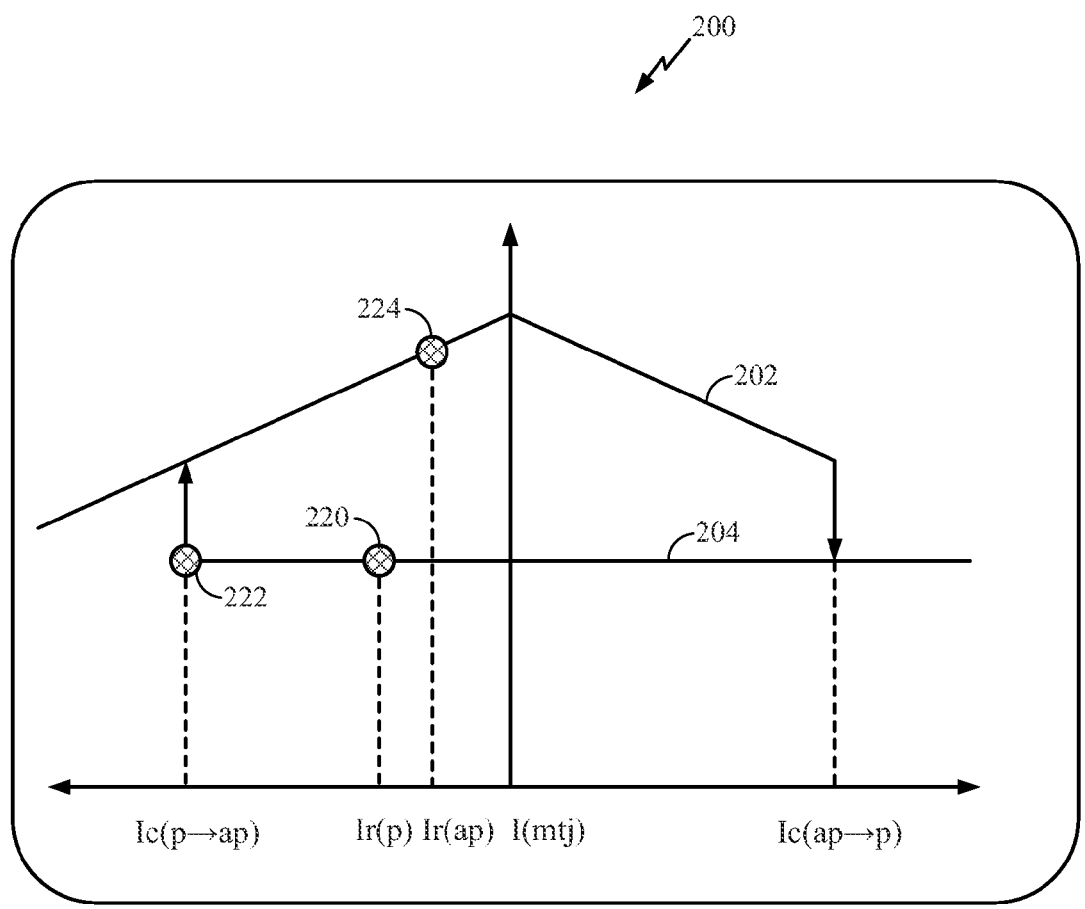
FIG. 2B is a graph illustrating a read disturb event for a magnetic tunnel junction in a parallel state.
Figure 3:
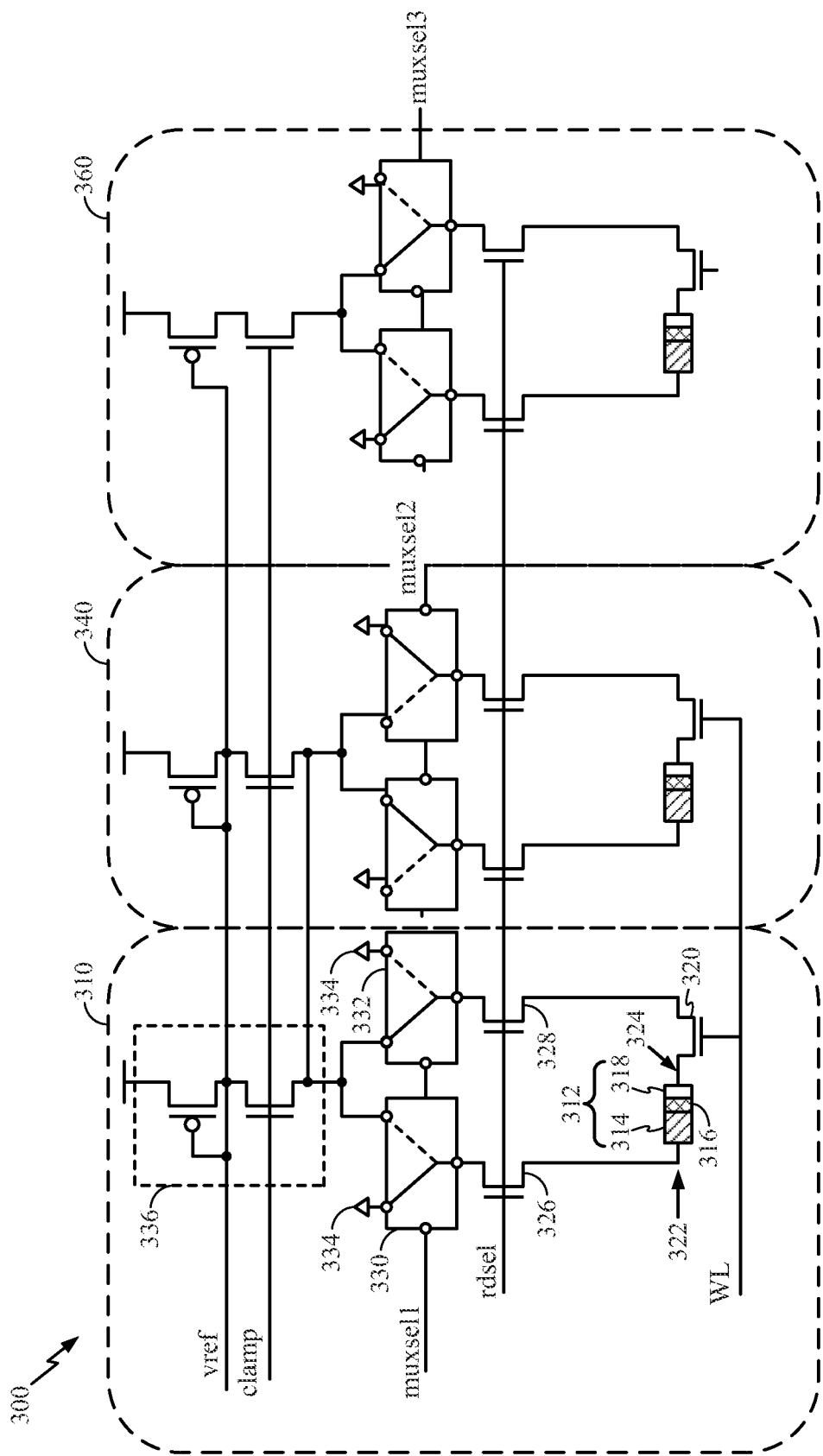
FIG. 3 is a circuit schematic illustrating a portion of an exemplary MRAM according to one embodiment.

FIG. 3 is a circuit schematic illustrating a portion of an exemplary MRAM according to one embodiment. An MRAM 300 includes bitcells 310, 340, 360. The bitcells 310, 340 may be reference bitcells, and the bitcell 360 may be a data bitcell. Each bitcell 310, 340, 360 is substantially similar in layout. For example, each bitcell 310, 340, 360 includes a magnetic tunnel junction (MTJ) 312 having layers 314, 316, 318. The layer 314 may be a fixed layer, the layer 316 a tunneling barrier, and the layer 318 a free layer. According to one embodiment, the fixed layer 314 is a pinned layer such as a synthetic antiferromagnet (SAF). According to one embodiment, the free layer 318 is an alloy of cobalt (Co) and/or iron (Fe), and the tunneling barrier layer 316 is an oxide such as magnesium oxide (MgO).

The MTJ 312 is coupled to a select transistor 320 controlled by a word line, WL. The MTJ 312 has a first terminal 322 and a second terminal 324 coupled to a read select transistor 326, 328, respectively. The read select transistors 326, 328 are controlled by a read select line, RDSEL. Coupled to the read select transistors 326, 328 are multiplexers 330, 332, respectively. The multiplexers 330, 332 toggle the first terminal 322 and the second terminal 324 of the MTJ 312 from a ground 334 to a voltage source 336. The multiplexers 330, 332 are controlled by a multiplexer select line, MUXSEL1.

When the MUXSEL1 signal is high, the multiplexers 330, 332 couple the first terminal 322 and the second terminal 324 of the MTJ 312 to the ground 334 and the voltage source 336, respectively, such that current flows through the MTJ in a clockwise fashion from the free layer 318 to the fixed layer 314. When the MUXSEL1 signal is low, the multiplexers 330, 332 couple the first terminal 322 and the second terminal 324 of the MTJ 312 to the voltage source 336 and the ground 334, respectively, such that current flows through the MTJ in a counter-clockwise fashion from the fixed layer 314 to the free layer 318.

Each of the bitcells 310, 340, 360 may have multiplexers controlled by the same multiplexer select signal, or the bitcells 310, 340, 360 may have separate multiplexer select signals. According to one embodiment, the bitcells 310, 340, 360 may have multiplexers controlled by multiplexer select signals, MUXSEL1, MUXSEL2, and MUXSEL3, respectively.

According to one embodiment, the reference bitcells 310, 340 have MTJ in a parallel alignment state and an anti-parallel state, respectively. That is, the fixed layer and the free layer of the MTJ 312 of the reference bitcell 310 have magnetizations aligned substantially parallel. Also, the fixed layer and the free layer of the MTJ of the reference bitcell 340 have magnetizations aligned substantially anti-parallel. Different multiplexer select signals may be applied to the reference bitcells 310, 340 to reduce read disturb of the reference bitcells 310, 340.

The reference bit cells 310, 340 generate a "vref" signal which is used as a reference voltage for sensing of the MTJ in the data bit cell 360. More specifically, the bit cells 310, 340 generate the vref voltage which makes the current through the PMOS in the data bit cell 360 equivalent to the current flow through the two MTJs: the parallel state MTJ 312 and the anti parallel state MTJ of the reference hit cell 340, in parallel connection.

The clamp is provided by another generator unit (not shown) and limits the current amount flowing through the MTJs to reduce any possible read disturb. Also, high sensing margin can be achieved because high tunnel magnetic resistance can be obtained by reducing the voltage across the MTJs. (The higher voltage across the tunnel magnetic resistance, the lower the tunnel magnetic resistance the MTJ has.)

Figure 4:
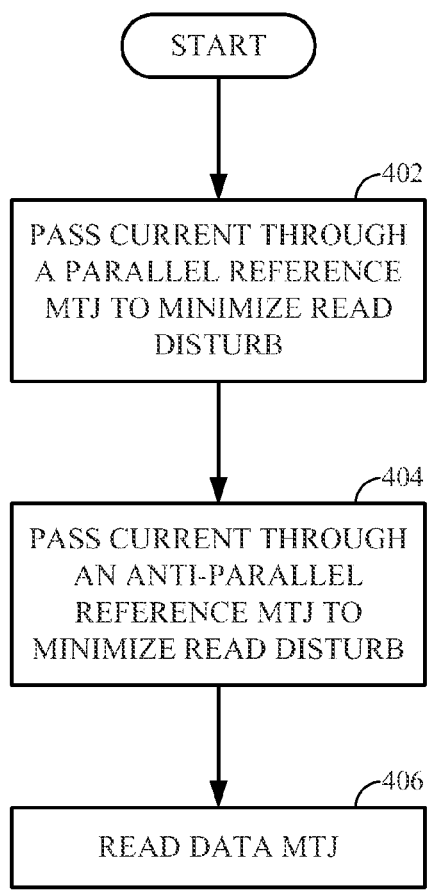
FIG. 4 is a flow chart illustrating operation of the exemplary MRAM according to one embodiment.

FIG. 4 is a flow chart illustrating operation of the exemplary MRAM according to one embodiment. At block 402 current is passed through a parallel reference MTJ in a direction, selected by the MUXSEL1 signal, that reduces read disturb. For example, the MUXSEL1 signal may be high and the current flows in a clockwise direction through the parallel reference MTJ 312 of the reference bitcell 310. At block 404 current is passed through an anti-parallel reference MTJ in a direction, selected by the MUXSEL2 signal, that reduces read disturb. For example, the MUXSEL2 signal may be low, and the current flows in a counter-clockwise direction through an anti-parallel reference MTJ of the reference bitcell 340. At block 406 a read operation is performed on a data MTJ by passing current through the data MTJ of the bitcell 360. Passing current through the parallel reference NW of the bitcell 310, the anti-parallel reference MTJ of the bitcell 340, and the data MTJ of the bitcell 360 may occur substantially simultaneously during a read operation of the MRAM 100.

According to another embodiment, the multiplexer select signals MUXSEL1, MUXSEL2, MUXSEL3 are the same signal. That is, when MUXSEL1 is high, MUXSEL2 is high, and MUXSEL3 is high. Read disturb may be reduced by alternating the direction of current flow through the MTJs of the bitcells 310, 340, 360. For example, during a first read operation, current flow in the MTJs of the bitcells 310, 340, 360 may be in a clockwise direction, and during a second read operation, current flow in the MTJs of the bitcells 310, 340, 360 may be in a counter-clockwise direction. Toggling between the clockwise and counter-clockwise directions is controlled by the multiplexer select signals MUXSEL1, MUXSEL2, MUXSEL3. Coupling the select signals together may reduce complexity of the peripheral circuitry of the MRAM 300.

Switching the direction of the current flow reduces read disturb by reducing the number of read operations, and potential read disturbs, the bitcells 310, 340, 360 are subjected to. That is, if the MTJ 312 of the bitcell 310 is in a parallel state, current flow in the anti-parallel direction results in a read disturb. When the direction of current flow through the MTJ 312 of the bitcell 310 is switched by the multiplexers 330, 332 after read operations, the number of potential read disturbs the MTJ 312 is subjected to is reduced by half. According to one embodiment, the multiplexer select signals MUXSEL1, MUXSEL2, MUXSEL3 are toggled after each read operation. The multiplexer select signals MUXSEL1, MUXSEL2, MUXSEL3 may also be toggled in other time intervals. For example, the multiplexer select signals MUXSEL1, MUXSEL2, MUXSEL3 may be toggled every ten read cycles.

Figure 5:
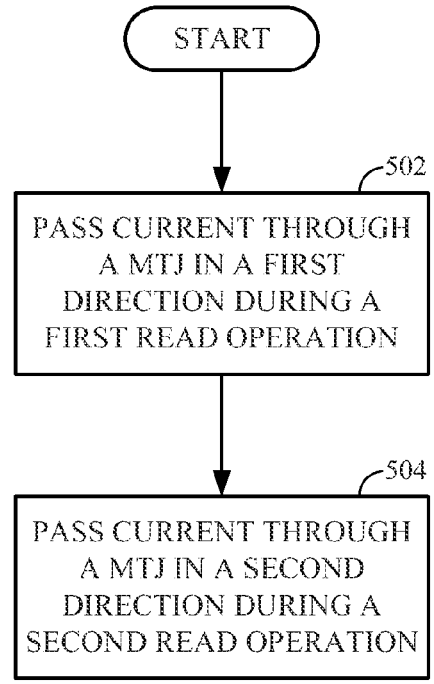
FIG. 5 is a flow chart illustrating operation of the exemplary MRAM according to one embodiment.

FIG. 5 is a flow chart illustrating operation of the exemplary MRAM according to one embodiment. At block 502 current is passed through the MTJ 312 of the bitcell 310 in a first direction during a first read operation. At block 504 current is passed through the MTJ 312 of the bitcell 310 in a second direction during a second read operation. For example, current may flow through the MTJ 312 in a clockwise direction during the first read operation and in a counter-clockwise direction during the second read operation.

Figure 6:
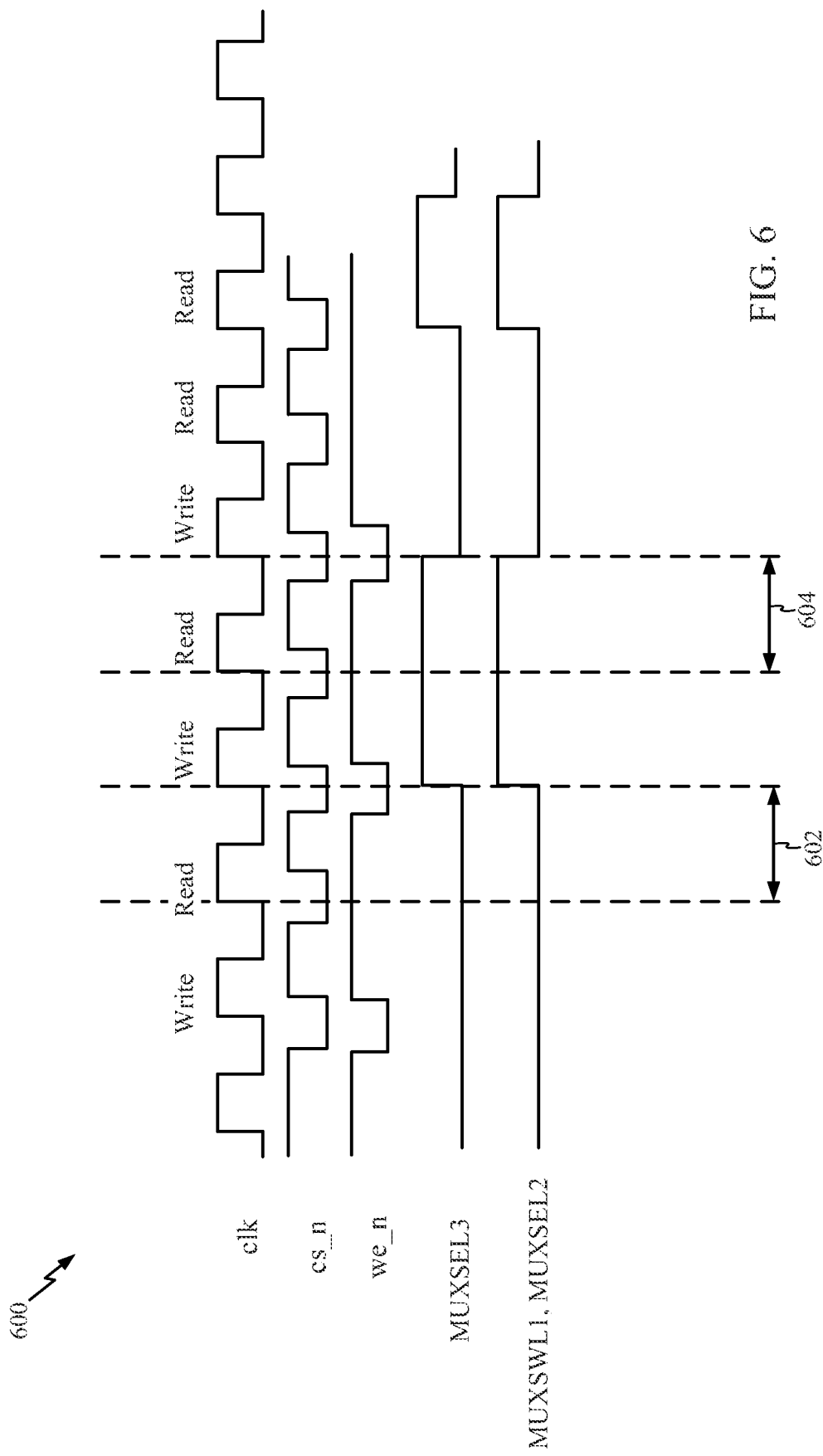
FIG. 6 is a timing diagram illustrating operation of the exemplary MRAM according to one embodiment.

FIG. 6 is a timing diagram illustrating operation of the exemplary MRAM according to one embodiment. The timing diagram 600 includes a clock signal, CLK, a chip select signal, CS_N, a write enable signal, WE_N, data MTJ multiplexer select signal, MUXSEL3, and reference MTJ multiplexer select signals, MUXSEL1 and MUXSEL2. During a first read operation 602 the multiplexer select signals MUXSEL1, MUXSEL2, MUXSEL3 are high indicating a clockwise direction of current in the bitcells 310, 340, 360. During a second read operation 604 the multiplexer select signals MUXSEL1, MUXSEL2, MUXSEL3 are low indicating a counter-clockwise direction of current in the bitcells 310, 340, 360. According to one embodiment, the multiplexer select signals, MUXSEL1, MUXSEL2, MUXSEL3 toggle between high and low after each read operation according to a defined sequence.

According to one embodiment, when the bitcells 310, 340 are reference bitcells, the current may be fixed in substantially one direction through the reference bitcells 310, 340 while current direction is toggled in the data bitcell 360 according to a sequence. Thus, the number of read disturbs the reference bitcells 310, 340 are subjected to is further reduced.

Figure 7:
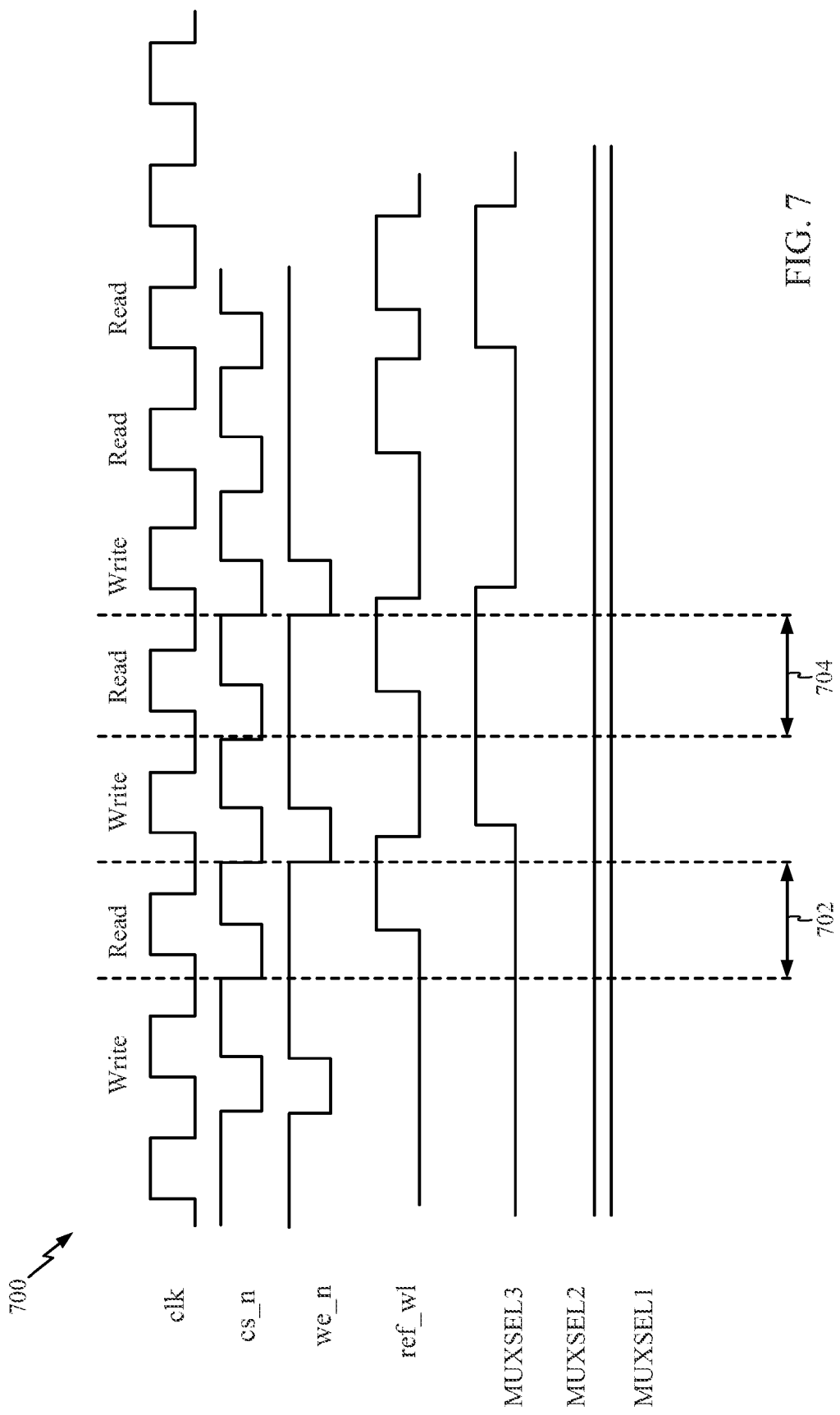
FIG. 7 is a timing diagram illustrating operation of the exemplary MRAM according to one embodiment.

FIG. 7 is a timing diagram illustrating operation of the exemplary MRAM according to one embodiment. The timing diagram 700 includes a clock signal, CLK, a chip select signal, CS_N, a write enable signal, WE_N, data MTJ multiplexer select signal, MUXSEL3, and reference MTJ multiplexer select signals, MUXSEL1 and MUXSEL2. During a first read operation 702 the multiplexer select signals MUXSEL1, MUXSEL2, MUXSEL3 are high, low, and low, respectively. Thus, current flow through the parallel reference bitcell 310 is clockwise, current flow through the anti-parallel reference bitcell 340 is counter-clockwise, and current flow through the data bitcell 360 is counter-clockwise. During a second read operation 704 the multiplexer select signals MUXSEL1, MUXSEL2, MUXSEL3 are high, low, and high, respectively. Thus, current flow through the parallel reference bitcell 310 is clockwise, current flow through the anti-parallel reference bitcell 340 is counter-clockwise, and current flow through the data bitcell 360 is clockwise.

A MRAM device with multiplexers to control the direction of current flow through MTJs decreases the likelihood of a read disturb event in an MTJ, and thus preserves the data stored in the MRAM device. For example, the current direction may be controlled through a reference MTJ based on the known state of the MTJ. That is, the current direction through the reference MTJ selected is chosen to reduce read disturb events of the reference MTJ. In reference and data MTJs the direction of current in the MTJ may be alternated between two directions between read operations. Switching the direction of current subjects the MTJ to approximately half the number of read disturb events.

Figure 8:
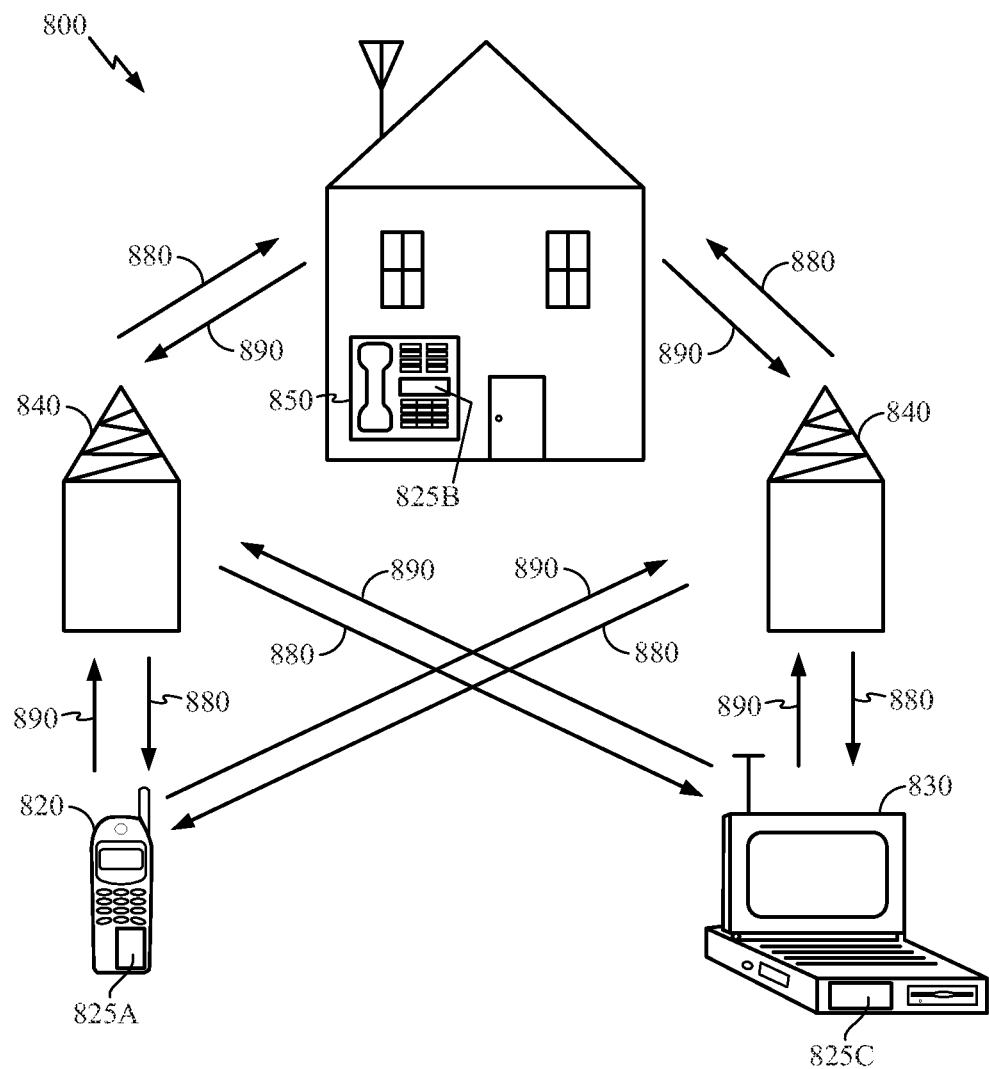
FIG. 8 is a block diagram showing an exemplary wireless communication system in which an embodiment of the disclosure may be advantageously employed.

FIG. 8 is a block diagram showing an exemplary wireless communication system 800 in which an embodiment of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C and 825B, that include the disclosed MRAM. It will be recognized that any device containing an IC may also include the MRAM disclosed here, including the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 8 illustrates remote units according to the teachings of the disclosure, the disclosure is not limited to these exemplary illustrated units. Embodiments of the disclosure may be suitably employed in any device which includes MRAM.

Figure 9:
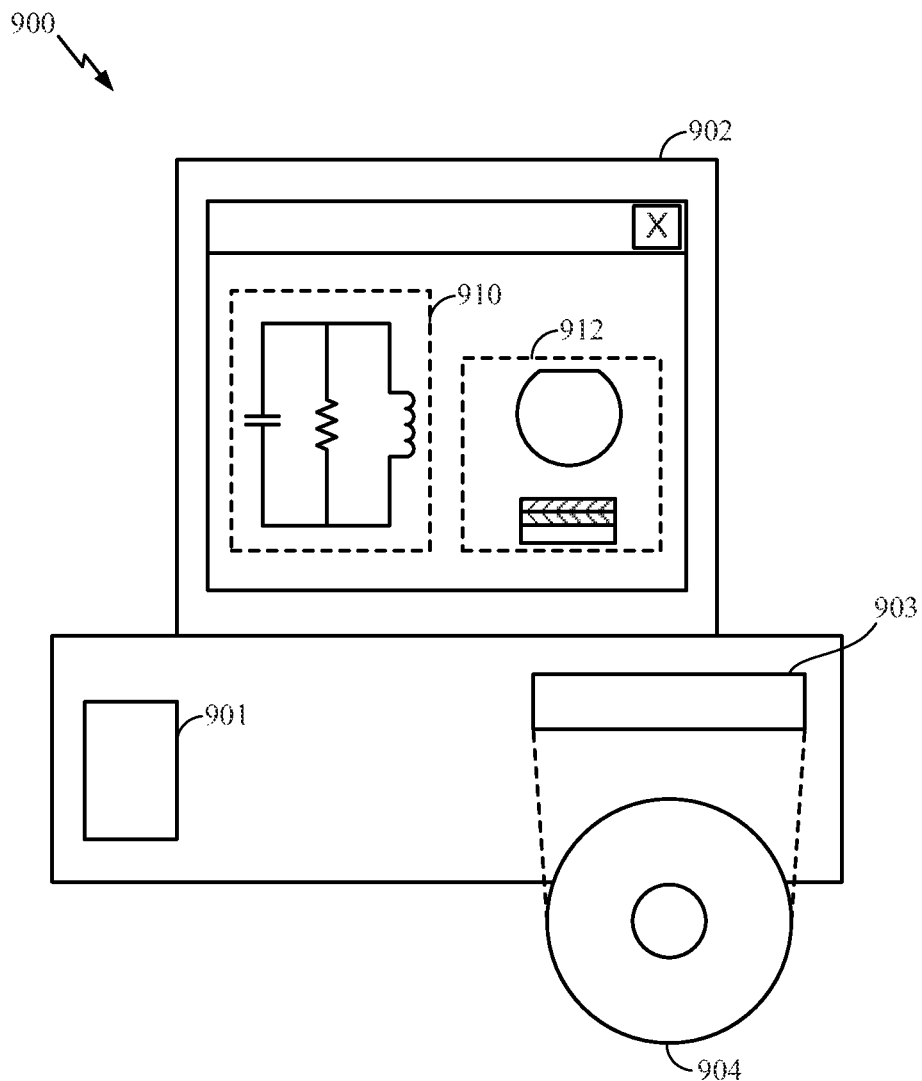
FIG. 9 is a block diagram illustrating a design workstation used for circuit, layout, and logic design of a semiconductor component according to one embodiment.

FIG. 9 is a block diagram illustrating a design workstation used for circuit, layout, and logic design of a semiconductor component, such as a MRAM as disclosed above. A design workstation 900 includes a hard disk 901 containing operating system software, support files, and design software such as Cadence or OrCAD. The design workstation 900 also includes a display to facilitate design of a circuit 910 or a semiconductor component 912 such as a packaged integrated circuit having MRAM. A storage medium 904 is provided for tangibly storing the circuit design 910 or the semiconductor component 912. The circuit design 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 901 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 or the semiconductor component 912 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and bin-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. An apparatus, comprising:
a magnetic tunnel junction having a first terminal and a second terminal;
a first read select transistor coupled between the first terminal of the magnetic tunnel junction and a first multiplexer, the first multiplexer being coupled to a voltage source and coupled to a ground, the first multiplexer being configured to receive a first control signal to toggle the voltage source and the ground to the first terminal via the first read select transistor;
a second read select transistor coupled between the second terminal of the magnetic tunnel junction and a second multiplexer, the second multiplexer being coupled to the voltage source, and coupled to the ground, the second multiplexer being configured to receive a second control signal to toggle the voltage source and the ground to the second terminal; and
a read select line coupled to the first read select transistor and the second read select transistor and configured to simultaneously turn on the first read select transistor and the second read select transistor.

2. The apparatus of claim 1, in which the magnetic tunnel junction is a reference magnetic tunnel junction having one of a parallel and an anti-parallel configuration, and in which the first multiplexer control signal and the second multiplexer control signal are selected to correspond to the configuration of the reference magnetic tunnel junction.

3. The apparatus of claim 1, in which the magnetic tunnel junction is a data magnetic tunnel junction, and in which the first multiplexer control signal and the second multiplexer control signal are toggled after a read of the data magnetic tunnel junction.

4. The apparatus of claim 1, in which the magnetic tunnel junction is integrated into a magnetic random access memory (MRAM).

5. The apparatus of claim 1, in which the magnetic tunnel junction is integrated into at least one of a mobile phone, a set top box, a music player, a video player, an entertainment unit, a navigation device, a computer, a hand-held personal communication systems (PCS) unit, a portable data unit, and a fixed location data unit.

6. A method, comprising:
signaling a first multiplexer, the first multiplexer selecting to pass a first current through a parallel reference magnetic tunnel junction from a free layer to a fixed layer of the parallel reference magnetic tunnel junction in response to the signaling of the first multiplexer;
signaling a second multiplexer, the second multiplexer selecting to pass a second current through an anti-parallel reference magnetic tunnel junction from a fixed layer to a free layer of the anti-parallel reference magnetic tunnel junction in response to the signaling of the second multiplexer; and
reading a data magnetic tunnel junction during the passing of the first current and the passing of the second current.

7. The method of claim 6, in which reading the data magnetic tunnel junction comprises passing a third current through the data magnetic tunnel junction in at least one of a first direction from a free layer of the data magnetic tunnel junction to a fixed layer of the data magnetic tunnel junction and a second direction from the fixed layer of the data magnetic tunnel junction to the free layer of the data magnetic tunnel junction,
in which the third current is in the first direction when a previous read of the data magnetic tunnel junction was in the second direction, and
in which the third current is in the second direction when the previous read of the data magnetic tunnel junction was in the first direction.

8. The method of claim 7, in which the previous read comprises the previous read immediately preceding the reading the data magnetic tunnel junction.

9. The method of claim 6, further comprising integrating the parallel reference magnetic tunnel junction, the anti-parallel reference magnetic tunnel junction, and the data magnetic tunnel junction into a magnetic random access memory (MRAM).

10. The method of claim 9, further comprising integrating the MRAM into at least one of a mobile phone, a set top box, a music player, a video player, an entertainment unit, a navigation device, a computer, a hand-held personal communication systems (PCS) unit, a portable data unit, and a fixed location data unit.

11. A method, comprising:
passing current in a first direction, from a free layer to a fixed layer, through a parallel reference magnetic tunnel junction, an anti-parallel reference magnetic tunnel junction, and a data magnetic tunnel junction during a first read operation; and
passing current in a second direction, from a fixed layer to a free layer, through the parallel reference magnetic tunnel junction, the anti-parallel reference magnetic tunnel junction, and the data magnetic tunnel junction during a second read operation, the second direction being different from the first direction, and the first read operation and the second read operation form a sequence.

12. The method of claim 11, further comprising integrating the parallel, anti-parallel, and data magnetic tunnel junctions into a magnetic random access memory (MRAM).

13. The method of claim 11, further comprising integrating the parallel, anti-parallel, and data magnetic tunnel junctions into at least one of a mobile phone, a set top box, a music player, a video player, an entertainment unit, a navigation device, a computer, a hand-held personal communication systems (PCS) unit, a portable data unit, and a fixed location data unit.

14. An apparatus, comprising:
a magnetic tunnel junction having a first terminal and a second terminal;
first-means for selecting read circuitry coupled between the first terminal of the magnetic tunnel junction and a first means for multiplexing, the first multiplexing means being coupled to a voltage source and coupled to a ground, the first multiplexing means being configured to toggle the first terminal between the voltage source and the ground via the first selecting means;
second means for selecting read circuitry coupled between the second terminal of the magnetic tunnel junction and a second means for multiplexing, the second multiplexing means being coupled to the voltage source and coupled to the ground, the second multiplexing means being configured to toggle the second terminal between the voltage source and the ground; and
a read select line coupled to the first selecting means and the second selecting means and configured to simultaneously turn on the first selecting means and the second selecting means.

15. The apparatus of claim 14, in which the first multiplexing means and the second multiplexing means are toggled after each read operation.

16. The apparatus of claim 14, in which the magnetic tunnel junction is integrated into a magnetic random access memory (MRAM).

17. The apparatus of claim 14, in which the magnetic tunnel junction is integrated into at least one of a mobile phone, a set top box, a music player, a video player, an entertainment unit, a navigation device, a computer, a hand-held personal communication systems (PCS) unit, a portable data unit, and a fixed location data unit.

18. A method, comprising the steps of:
signaling a first multiplexer, the first multiplexer selecting to pass a first current through a parallel reference magnetic tunnel junction from a fixed layer to a free layer of the parallel reference magnetic tunnel junction in response to the signaling of the first multiplexer;
signaling a second multiplexer, the second multiplexer selecting to pass a second current through an anti-parallel reference magnetic tunnel junction from a free layer to a fixed layer of the anti-parallel reference magnetic tunnel junction in response to the signaling of the second multiplexer; and
reading a data magnetic tunnel junction during the passing of the first current and the passing of the second current.

19. The method of claim 18, further comprising the step of integrating the parallel reference magnetic tunnel junction, anti-parallel reference magnetic tunnel junction, and data magnetic tunnel junction into at least one of a mobile phone, a set top box, a music player, a video player, an entertainment unit, a navigation device, a computer, a hand-held personal communication systems (PCS) unit, a portable data unit, and a fixed location data unit.

20. A method, comprising the steps of:
passing current in a first direction, from a free layer to a fixed layer, through a parallel reference magnetic tunnel junction, an anti-parallel reference magnetic tunnel junction, and a data magnetic tunnel junction during a first read operation; and
passing current in a second direction, from a fixed layer to a free layer, through the parallel reference magnetic tunnel junction, the anti-parallel reference magnetic tunnel junction, and the data magnetic tunnel junction during a second read operation, the second direction being different from the first direction, and the first read operation and the second read operation form a sequence.

21. The method of claim 20, further comprising the step of integrating the parallel reference magnetic tunnel junction, anti-parallel reference magnetic tunnel junction, and data magnetic tunnel junction into at least one of a mobile phone, a set top box, a music player, a video player, an entertainment unit, a navigation device, a computer, a hand-held personal communication systems (PCS) unit, a portable data unit, and a fixed location data unit.

* * * * *